United States Patent [19]
Pakulski et al.

[11] Patent Number: 5,567,659
[45] Date of Patent: Oct. 22, 1996

[54] METHOD OF ETCHING PATTERNS IN III-V MATERIAL WITH ACCURATE DEPTH CONTROL

[75] Inventors: Grzegorz Pakulski, Woodlawn; Cornelis Blaauw, Kanata; Agnes Margittai, Ottawa; Ronald Moore, Stittsville, all of Canada

[73] Assignee: Northern Telecom Limited, Montreal, Canada

[21] Appl. No.: 450,839

[22] Filed: May 25, 1995

[51] Int. Cl.⁶ .................................................. H01L 21/302
[52] U.S. Cl. .................. 437/228; 156/646.1; 156/651.1; 216/19; 216/76; 216/101
[58] Field of Search .................................. 216/17, 19, 76, 216/101; 156/646.1, 650.1, 651.1; 437/228

[56] References Cited

U.S. PATENT DOCUMENTS

| | | | |
|---|---|---|---|
| 3,833,435 | 9/1974 | Logan et al. | 156/643.1 |
| 3,898,141 | 8/1975 | Ermanis et al. | 204/129.43 |
| 4,326,911 | 4/1982 | Howard et al. | 156/643.1 |
| 4,670,093 | 6/1987 | Maerz et al. | 156/649 |
| 4,883,768 | 11/1989 | Swindal et al. | 156/661.11 |

FOREIGN PATENT DOCUMENTS

| | | |
|---|---|---|
| 59-179149 | 10/1984 | Japan . |
| 61-292923 | 12/1986 | Japan . |
| 04373126 | 12/1992 | Japan . |
| 05109670 | 4/1993 | Japan . |
| 06216091 | 8/1994 | Japan . |
| 2085654 | 4/1982 | United Kingdom . |

Primary Examiner—R. Bruce Breneman
Assistant Examiner—George Goudreau
Attorney, Agent, or Firm—George MacGregor

[57] ABSTRACT

A method of accurately controlling the depth of etched gratings in uniform or layered quaternary III–V material. A native oxide is selectively grown on the area of the quaternary to be patterned and this native oxide is subsequently removed to engrave the surface. Periodic repetition of the oxide growth/removal steps results in gratings of the desired depths.

14 Claims, 2 Drawing Sheets

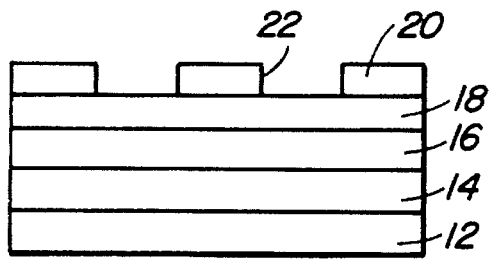
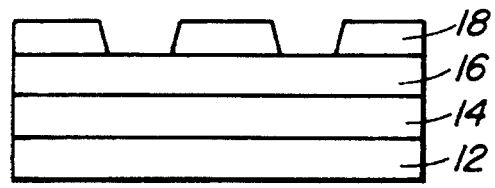
FIG. IA
FIG. IB
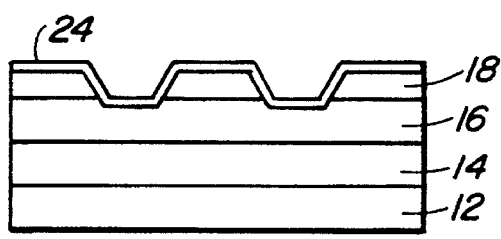
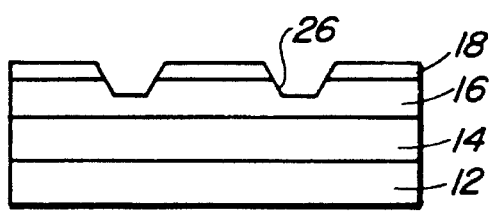
FIG. IC
FIG. ID
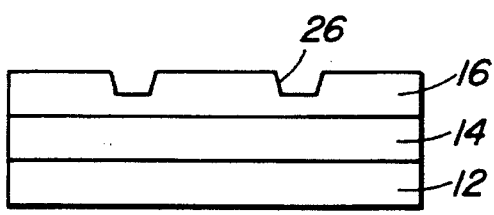
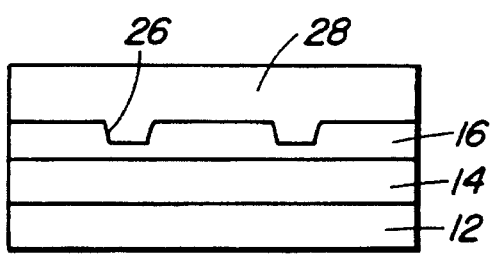
FIG. IE
FIG. IF

METHOD OF ETCHING PATTERNS IN III-V MATERIAL WITH ACCURATE DEPTH CONTROL

FIELD OF THE INVENTION

This invention relates to a method of etching semiconductors and more particularly to a method of etching patterns in III-V semiconductor materials with near-atomic layer depth accuracy.

BACKGROUND OF THE INVENTION

Advanced techniques of epitaxially growing semiconductor materials, for example, metal organic chemical vapour disposition (MOCVD), have resulted in layer thickness control to near-atomic values. This has led to the development of new active device structures such as multilayer configurations incorporating multi-quantum-wells and asymmetrical confinement layers. These developments have, in turn, resulted in the realization of surface or buried corrugations in Distributed Feedback (DFB) or Distributed Bragg Reflector (DBR) injection lasers. Precise control over the depth of etched corrugated waveguide gratings is, in fact, an important aspect in the processing of many optoelectronic devices. In DFB lasers, for example, grating depth is an important criterion in determining the magnitude of the coupling coefficient. The aforementioned asymmetric confinement layers are instituted to reduce the carrier transport limitation of a laser response to direct current modulation. In such a configuration the confinement layer, which can be of the order of 20 nm, must be corrugated to achieve single, longitudinal mode operation. Further, gain coupled lasers have periodic corrugations which extend into one or more quantum wells. Accurate positioning of such etched gratings is critical to device performance. Growth techniques which permit the formation of very thin devices necessitate accurate control of etching processes in order to properly locate the corrugation, grating, etc.

PRIOR ART

Known techniques of grating formation in III-V materials involve holographic exposure with etching in a crystallographic HBr:HN0$_3$ based solution. This technique, however, is not capable of achieving the etching accuracy required by the devices referred to above. Reactive ion etching (RIE) does provide somewhat better control but can cause damage to the crystalline structure which, if in the vicinity of the active layer, can be catastrophic.

SUMMARY OF THE INVENTION

It is an object of the present invention to provide a method of accurately controlling the etching of III-V semiconductor materials.

It is another object of the invention to selectively remove material from a III-V semiconductor by the controlled growth and subsequent removal of a surface native oxide.

Therefore in accordance with the present invention there is provided a method of etching an exposed surface of a III-V semiconductor material comprising: growing a native oxide on the exposed surface and thereafter removing the oxide.

As the growth rate of a native oxide on III-V material is controllable, the amount of material removed with the removal of the oxide is also controllable. Repeating the growth-removal steps allows controllable etching of the exposed III-V material.

This controllable etching feature finds particular application in the formation of precisely etched patterns such as gratings. In this application a III-V layer, having different etching characteristics than the material in which the pattern is to be formed, is used as a mask. Thus, for example, a III-V binary alloy is used as a mask on a III-V ternary or quaternary alloy or vice versa.

Therefore, in accordance with a further aspect of the present invention there is provided a method of etching a pattern in a III-V semiconductor material. The method comprises: forming a protective layer on the III-V material, creating the desired pattern in the protective layer including the selective removal of the protection layer to expose the material, forming a native oxide on the exposed material and thereafter removing the native oxide. Repeating the oxide forming and removal steps can be used to accurately control the depth of the pattern in the III-V material. In one preferred embodiment the etched material is InGaAsP and the protective layer includes a layer of InP. Alternatively, GaAs can be the mask on AlGaAs. In both cases the mask layer and the etched material may be reversed.

BRIEF DESCRIPTION OF THE DRAWINGS

FIGS. 1A to 1F are sequential, cross-sectional views of material subject to periodic etching and regrowth to form a buried grating according to one aspect of the invention.

DETAILED DESCRIPTION OF THE INVENTION

Figure 2:
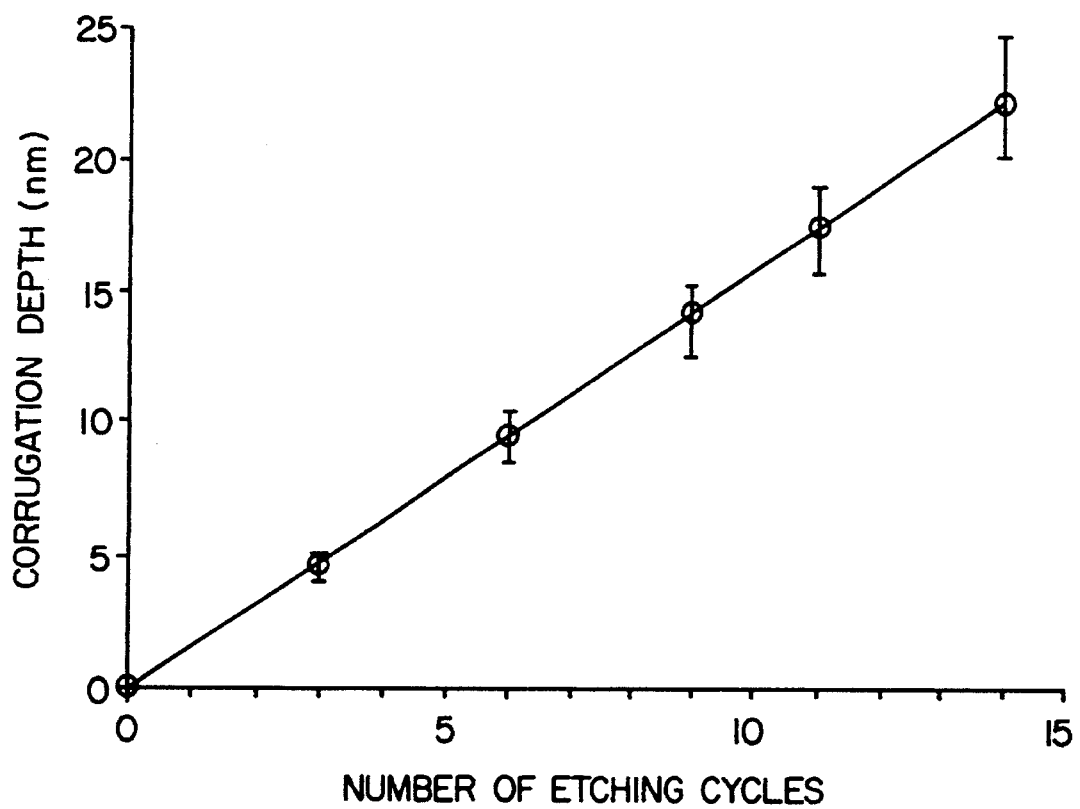
FIG. 2 is a graph of etching depth as a function of the number of etch steps employed.

The invention will now be described in greater detail with reference to the aforementioned drawings.

FIG. 1A is a cross-sectional view of a III-V semiconductor structure to be etched in accordance with the present invention. In this structure layers 12, 14 and 16 represent quaternary alloys having different compositional values. Layer 12 is a first quaternary designated $Q\lambda_1$, layer 14 is a second quaternary designated $Q\lambda_2$, and layer 16 is a third quaternary designated $Q\lambda_3$. In this embodiment the three quaternary layers are InGaAsP. The corrugation grating or pattern is to be formed in layer 16. The structure discussed here is intended as an example only and is not intended to limit the scope of the invention. Other configurations, including structures with and without quantum wells, are contemplated by the invention.

As shown in FIG. 1A a layer of InP 18 is grown on top of layer 16. This layer is at least as thick as the depth of the pattern to be etched in layer 16. A dielectric (e.g., Si$_3$N$_4$ or SiO$_2$) passivation layer 20 is grown on top of the InP layer 18. The dielectric layer is patterned utilizing photoresist (not shown) and holographic exposure as is well known. The dielectric layer is removed by, for example, dry etching CF$_4$ plasma in order to leave the pattern of openings 22 shown in FIG. 1A.

The InP layer 18 is then etched in HCL/H$_3$PO$_4$ as shown in FIG. 1B. The HCL/H$_3$PO$_4$ etchant used here is selective and as such crystallographically removes the InP layer only, stopping at the first Q layer 16. The dielectric mask layer is then removed and the InP cap layer becomes the final mask defining the pattern to be etched. This mask layer may be removed upon completion of the etching cycles or left on for subsequent processing.

The surface is subjected to a periodic etching sequence wherein native oxide is grown and subsequently removed. Native oxides may be grown on III–V materials by such means as thermal oxidation, UV-oxone oxidation, chemical oxidation or anodization. UV-oxone treatment of III–V materials improves the quality of subsequently grown epitaxial layers and is frequently used in semiconductor processing environments. The oxide thickness increases logarithmically as a function of UV-ozone exposure time. A 10 minute exposure results in a native oxide thickness of ~15Å on InP and ~30Å on GaAs. However an exposure of 30 minutes only increases the oxide thickness by ~5%. Thus the oxide thickness can be accurately controlled by the UV exposure time. In FIG. 1C the native oxide 24 is shown to have been grown on both the InP mask and on the Q layer exposed through the mask opening.

The native oxide is then removed by, for example, an etch in HF and the surface rinsed and dried. The etching time in HF is approximately 30 secs. This results in controlled removal of Q layer material to produce the corrugation 26 shown in FIG. 1D. The oxide growth and subsequent removal process is repeated as necessary to obtain the desired depth of the grating. Assuming an UV exposure time of 10 mins for each oxide growth cycle, it is possible to etch a 22±2 nm deep grating, corrugation, etc., with 14 etching cycles. FIG. 2 is a graph of etching depth as a function of the number of etching cycles for layered quaternary material. From the slope of this plot the etch rate can be estimated at ~1.6 nm/cycle. This represents a slow etch rate but this is off-set by the control with which the required depth can be accurately achieved. Further, the surface is very smooth and there is no undercutting.

After the etching cycles are completed the remaining InP mask may be selectively removed resulting in the structure shown in FIG. 1E. If a buried grating is required the etched surface is regrown with suitable III–V material 28 to give the device shown in FIG. 1F.

The accuracy with which material can be removed by the method of this invention is also applicable in the precise dimensioning of a mask pattern. In certain device structures having etched gratings, the line width of the mask requires precision beyond that which is available by photolithographic techniques. In these cases the line width of the mask as prepared by standard techniques is determined by accurate measuring means and an assessment is made as to how much material needs to be removed. Using the etch rate formula previously discussed the line width of the mask can be precisely formed by the oxide/removal process.

Although a particular embodiment of the invention has been described and illustrated, it will be apparent to one skilled in the art that many alternatives, modifications and variations are possible. The invention is intended to cover all such alternatives that fall within the scope of the appended claims.

We claim:

1. A method of etching a pattern in InGaAsP comprising:
    a) forming a masking layer of InP on said InGaAsP;
    b) creating said pattern on said masking layer;
    c) selectively removing said masking layer to expose said InGaAsP;
    d) forming a native oxide on said exposed InGaAsP by UV-ozone oxidation; and
    e) removing said native oxide.

2. A method as defined in claim 1, said steps (d) and (e) being repeated at least once.

3. A method as defined in claim 1, said steps (d) and (e) being repeated a plurality of times.

4. A method of etching a pattern in InP comprising:
    a) forming a masking layer of InGaAsP on said InP;
    b) creating said pattern on said masking layer;
    c) selectively removing said masking layer to expose said InP;
    d) forming a native oxide on said exposed InP by UV-ozone oxidation; and
    e) removing said native oxide.

5. A method as defined in claim 1, said pattern being a periodic grating.

6. A method of controllably etching a grating in a InGaAsP quaternary comprising:
    (a) growing a InP layer on top of said quaternary, the thickness of said InP layer being equal to or greater than the depth of the grating to be etched;
    (b) growing a dielectric layer on top of said InP layer;
    (c) coating said dielectric layer with a photoresist
    (d) photolithographically forming a pattern in said photoresist, said pattern corresponding to said grating;
    (e) etching said dielectric layer to selectively expose said InP layer;
    (f) etching said InP layer to expose said quaternary;
    (g) removing the residual dielectric layer from said InP layer;
    (h) growing a native oxide on said InP and said exposed quaternary; and
    (i) removing said native oxide.

7. A method as defined in claim 6, wherein steps (h) and (i) are repeated.

8. A method as defined in claim 7, wherein said native oxide is grown by UV-ozone oxidation.

9. A method as defined in claim 6, including the further step of removing the remaining InP layer.

10. A method as defined in claim 6, said native oxide being removed by etching.

11. A method as defined in claim 10, said native oxide being removed by etching in HF.

12. A method as defined in claim 4, said steps (d) and (e) being repeated at least once.

13. A method as defined in claim 4, said steps (d) and (e) being repeated a plurality of times.

14. A method as defined in claim 4, said pattern being a periodic grating.

* * * * *